United States Patent
Zhang et al.

(10) Patent No.: US 10,872,856 B2
(45) Date of Patent: Dec. 22, 2020

(54) SEMICONDUCTOR DEVICE INCLUDING THROUGH VIAS IN MOLDED COLUMNS

(71) Applicant: WESTERN DIGITAL TECHNOLOGIES, INC., San Jose, CA (US)

(72) Inventors: Yazhou Zhang, Shanghai (CN); Chin-Tien Chiu, Taichung (TW); Cong Zhang, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/277,467

(22) Filed: Feb. 15, 2019

(65) Prior Publication Data

US 2020/0006221 A1  Jan. 2, 2020

(30) Foreign Application Priority Data

Jun. 28, 2018  (CN) .......................... 2018 1 0686950

(51) Int. Cl.
| | | |
|---|---|---|
| *H01L 29/66* | (2006.01) | |
| *H01L 21/469* | (2006.01) | |
| *H01L 23/522* | (2006.01) | |
| *H01L 23/538* | (2006.01) | |

(52) U.S. Cl.
CPC ...... *H01L 23/5226* (2013.01); *H01L 23/5386* (2013.01)

(58) Field of Classification Search
CPC ...................... H01L 23/5386; H01L 21/76898
USPC ........ 437/108, 586, 605, 612; 257/615, 735, 257/777, 778
See application file for complete search history.

(56) References Cited

U.S. PATENT DOCUMENTS

| | | | |
|---|---|---|---|
| 10,141,259 B1 * | 11/2018 | Nakano | H01L 21/76898 |
| 10,395,984 B2 * | 8/2019 | Backes | H01L 21/76885 |
| 2007/0045836 A1 | 3/2007 | Kwon et al. | |
| 2009/0014891 A1 | 1/2009 | Chang et al. | |
| 2011/0180932 A1 | 7/2011 | Sasaki et al. | |
| 2020/0066630 A1 * | 2/2020 | Bao | H01L 21/0217 |

FOREIGN PATENT DOCUMENTS

CN          101330025      12/2008

OTHER PUBLICATIONS

English language Abstract for CN101330025 published Dec. 24, 2008.
Office Action dated Sep. 27, 2020 (with Google machine translation to English) in Chinese Patent Application No. 201810686950.2.

* cited by examiner

*Primary Examiner* — Calvin Lee
(74) *Attorney, Agent, or Firm* — Vierra Magen Marcus LLP

(57) ABSTRACT

A semiconductor device is disclosed including a stack of semiconductor die. Openings are formed in the semiconductor die as they are added to the stack, which openings are aligned at different levels of the stack. The openings are filled with an electrically insulative compound to form a molded column through all semiconductor die in the stack. After all semiconductor die are added to the stack, a via may be drilled through the molded column to electrically interconnect each semiconductor die in the stack.

19 Claims, 8 Drawing Sheets

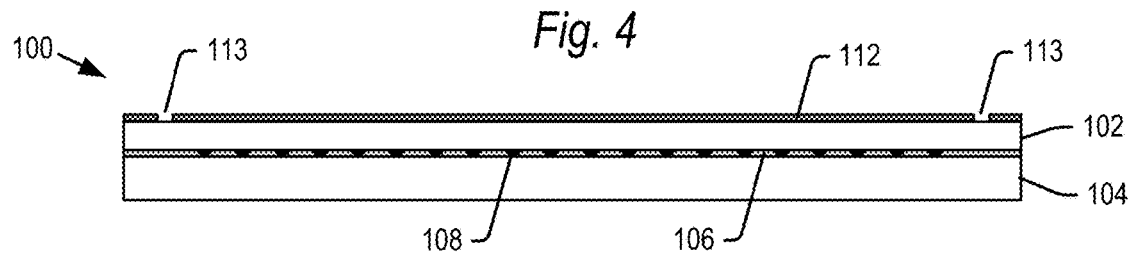
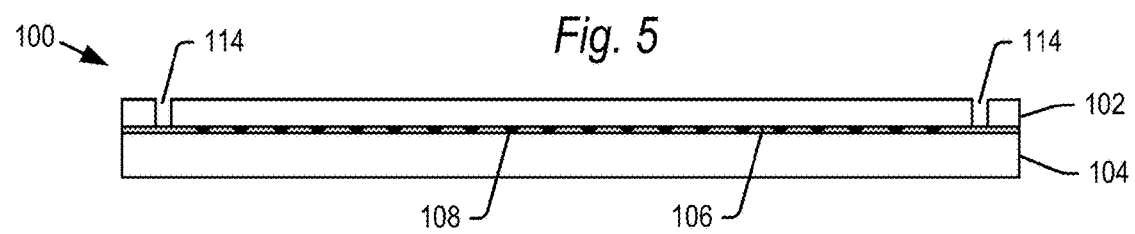
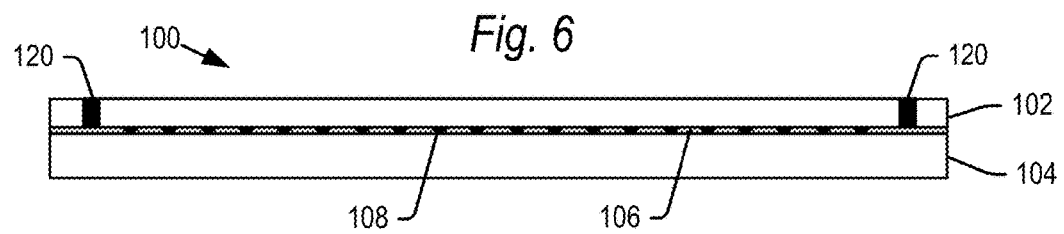
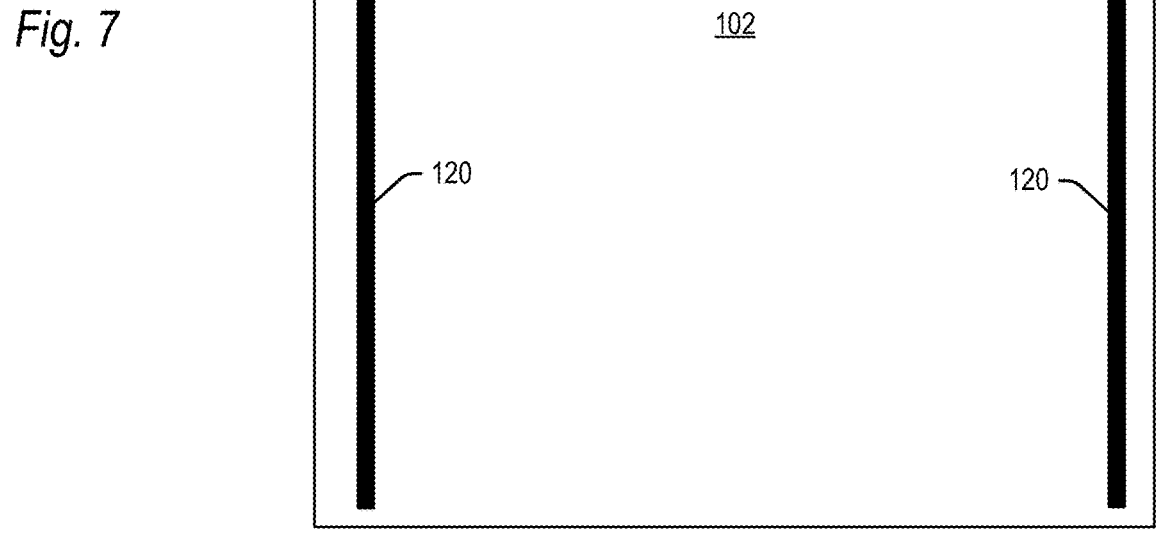

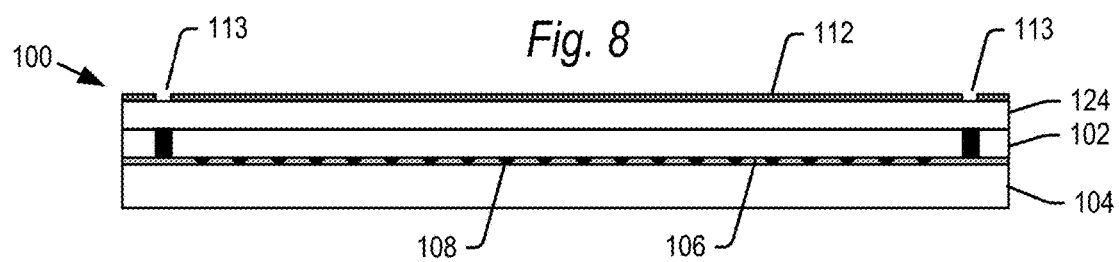
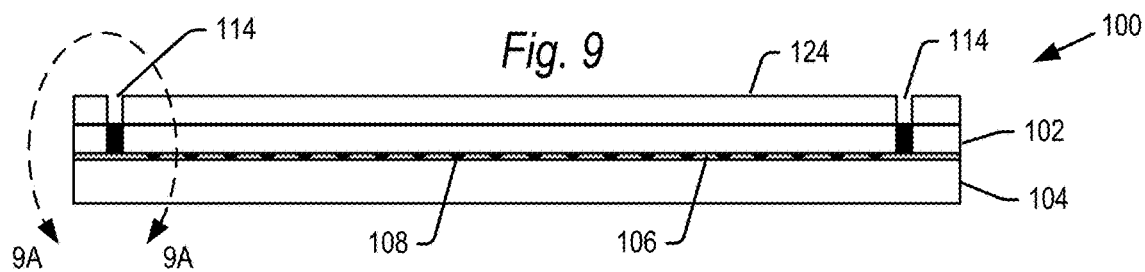
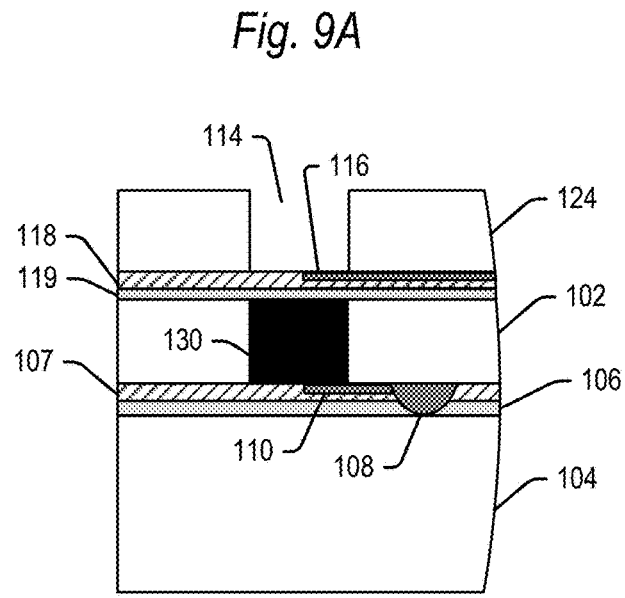

US 10,872,856 B2

1

SEMICONDUCTOR DEVICE INCLUDING THROUGH VIAS IN MOLDED COLUMNS

BACKGROUND

The strong growth in demand for portable consumer electronics is driving the need for high-capacity storage devices. Non-volatile semiconductor memory devices are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and computer SSDs.

While many varied packaging configurations are known, flash memory semiconductor devices may in general be fabricated as system-in-a-package (SIP) or multichip modules (MCM), where a plurality of semiconductor dies are mounted and interconnected to an upper surface of a substrate.

One method of electrical interconnection of the semiconductor dies is by through-silicon vias (TSVs). Conventional TSVs may typically be fabricated using five process steps: 1) via formation for example by deep reactive ion etch (DRIE); 2) SiO2 deposition for example by thermal oxidation or plasma-enhanced chemical vapor deposition (PECVD); 3) barrier and seed layer deposition by physical vapor deposition (PVD) or electrografting (eG); 4) copper plating or tungsten sputtering to fill the vias; and 5) chemical and mechanical polishing (CMP) to remove excess metal above the via. These traditional process steps have several drawbacks, including for example high cost, complex processes and resultant vias which are fragile.

DESCRIPTION OF THE DRAWINGS

FIGS. 4-6 are side views of a semiconductor device including a first semiconductor die mounted on a carrier at further steps in the fabrication process according to an embodiment of the present technology.

FIG. 7 is a top view of the first semiconductor die after the processing steps of FIGS. 4-6.

FIGS. 8-10 are side views of a semiconductor device including a second semiconductor die mounted on the first semiconductor die at further steps in the fabrication process according to an embodiment of the present technology.

FIG. 9A is an enlarged side view of a portion 9A-9A of the semiconductor device shown in FIG. 9.

2

Figure 16:
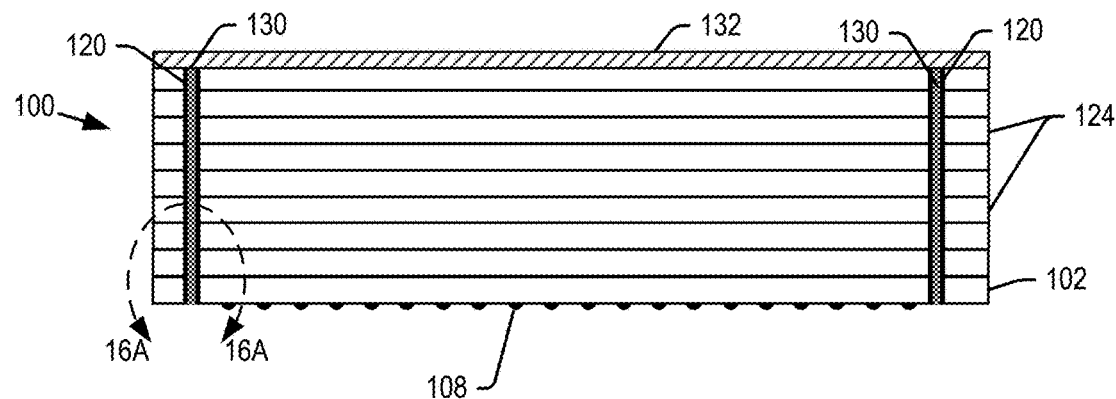
FIGS. 16 and 17 are side and bottom views, respectively, of a completed semiconductor device according to embodiments of the present technology.
Figure 16A:
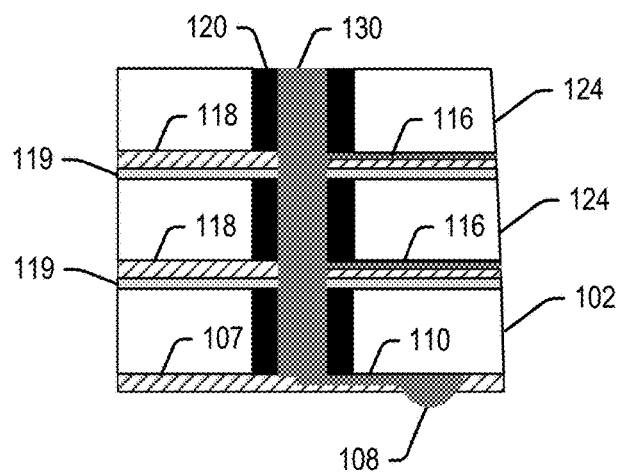

FIG. 16A is an enlarged side view of a portion 16A-16A of the semiconductor device shown in FIG. 16.

Figure 18:
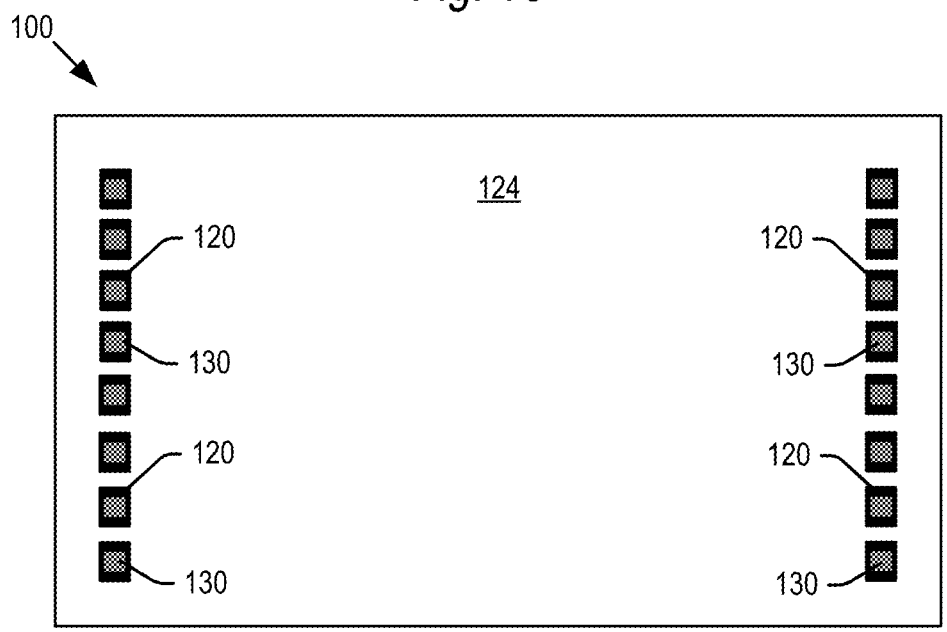

FIG. 18 is a top view of a semiconductor device during fabrication according to an alternative embodiment of the present technology.

DETAILED DESCRIPTION

The present technology will now be described with reference to the figures, which in embodiments, relate to a semiconductor device including a number of semiconductor dies, and vias formed within molded columns through the semiconductor dies. In embodiments, the semiconductor device may be formed by stacking one semiconductor die at a time, forming a pattern of openings through a newly added semiconductor die and filling the openings with a compound which hardens. The pattern of filled openings of each added semiconductor die align with those below so that the filled openings form molded columns through the die stack. Vias may then be drilled down through the molded columns and the drilled vias may be lined or filled with a conductor to electrically interconnect each of the semiconductor dies within the die stack.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±2.5% of a given dimension.

Figure 1:
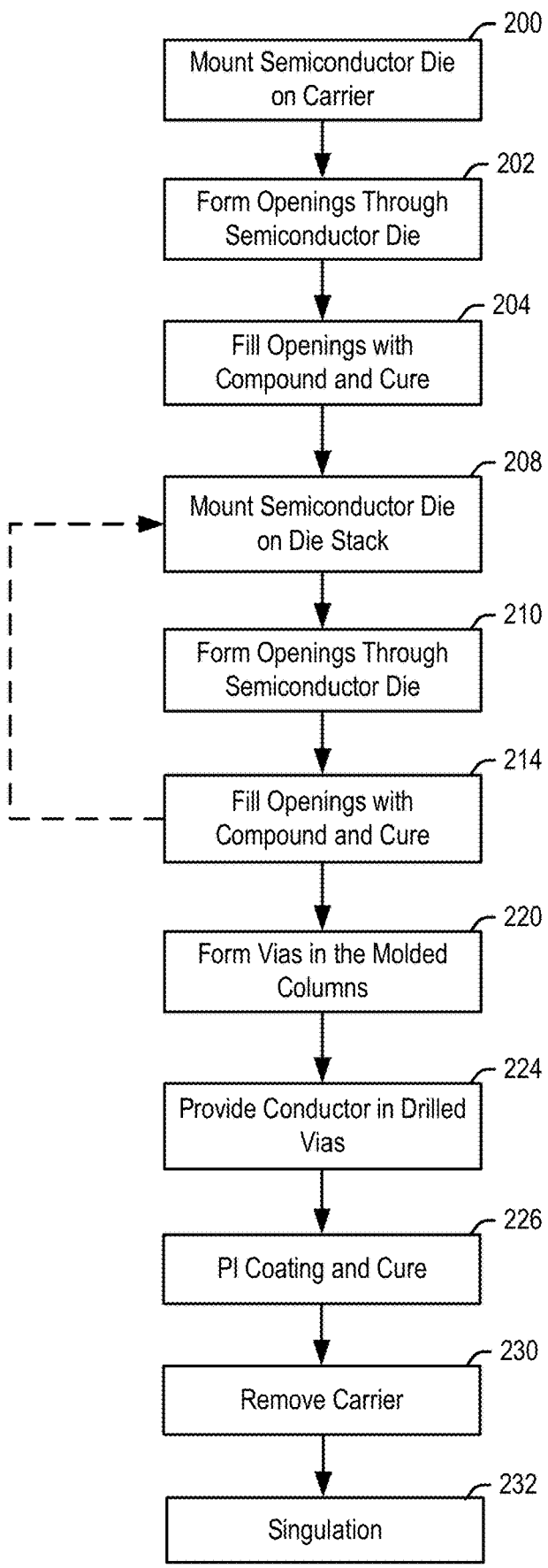
FIG. 1 is a flowchart of the overall fabrication process of a substrate and a semiconductor device using that substrate according to embodiments of the present technology.

An embodiment of the present technology will now be explained with reference to the flowchart of FIG. 1 and the top, bottom and side views of FIGS. 2 through 18. Although the figures show an individual semiconductor device 100, or a portion thereof, it is understood that the device 100 may be batch processed along with a plurality of other semiconductor devices on a carrier to achieve economies of scale. The number of rows and columns of devices 100 on the carrier may vary.

Figure 2:
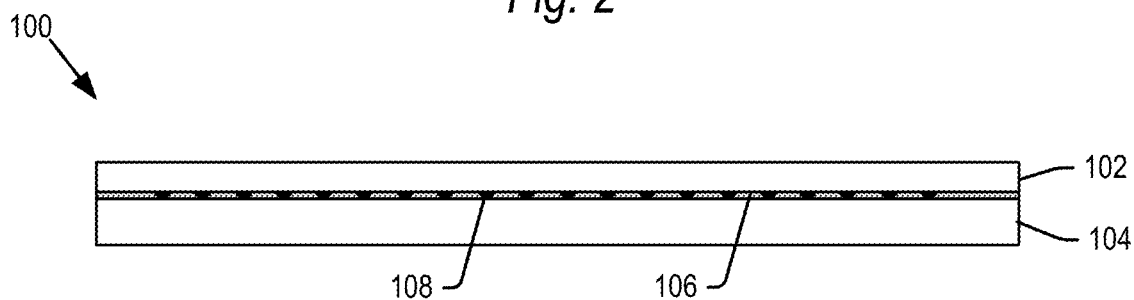
FIG. 2 is a side view of a semiconductor device including a first semiconductor die mounted on a carrier at a first step in the fabrication process according to an embodiment of the present technology.

In step 200, a first semiconductor die 102 may be mounted on a carrier 104 as shown in the side view of FIG. 2. The carrier 104 may be formed of a rigid material, such as for example glass, silicon dioxide, metal, polymer or other material. An adhesive release layer 106 may be provided on a surface of the carrier 104 for releasably mounting the first semiconductor die 102 onto the carrier 104.

Figure 3:
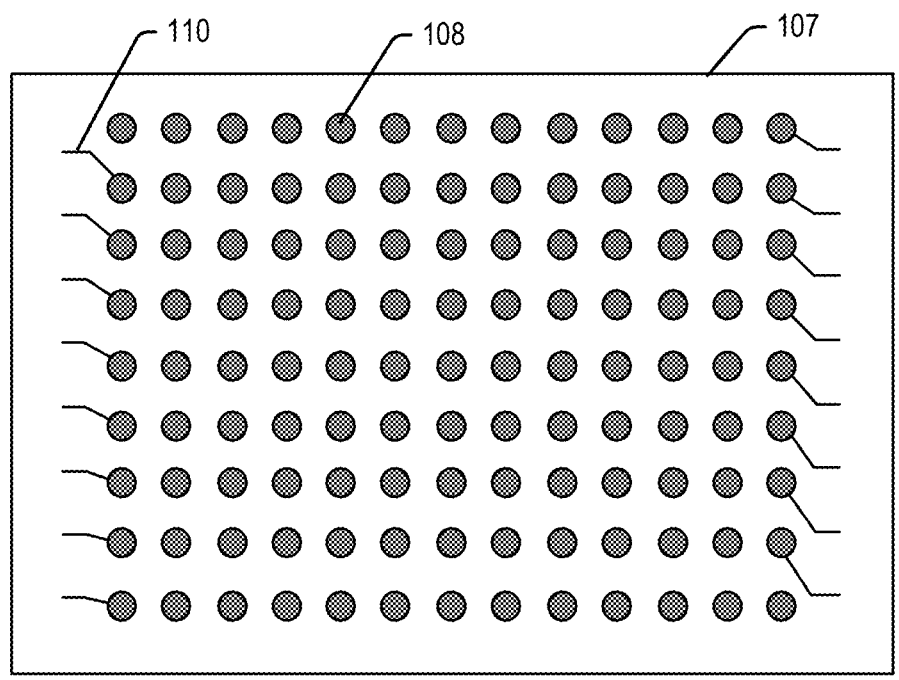
FIG. 3 is a top view of the first semiconductor die of FIG. 2.

In embodiments, the first semiconductor die 102 may be a controller die, such as for example an ASIC, but other types of dies may be used. These other types of semiconductor dies include but are not limited to flash memory, or RAM such as an SDRAM, DDR SDRAM, LPDDR and GDDR. As shown in the side and bottom views of FIGS. 2 and 3, the first semiconductor die 102 may include a pattern of solder balls 108 on a bottom surface, i.e., the surface that gets affixed to carrier 104. A conductance pattern including electrical traces 110 coupled to the solder balls 108 may also be formed in a polyimide layer 107 on a bottom surface of the first semiconductor die 102 (shown for example in FIG. 3 and FIG. 9A). The pattern of solder balls 108 and electrical traces 110 shown in FIG. 3 is by way of example only, and there may be other numbers and patterns of solder balls 108 and electrical traces 110 in further embodiments.

In step 202, a pattern of openings may be formed through the first semiconductor die 102. In particular, as shown in the side view of FIG. 4, a photoresist layer 112 may be applied on a surface of the first semiconductor die 102 opposite that mounted on carrier 104. A mask including a desired pattern of openings is applied to the photoresist layer 112, and the layer 112 is developed to define openings 113 in photoresist layer 112.

Step 202 next involves removal of the portions of the first semiconductor die 102 beneath the exposed openings 113 in photoresist layer 112. The result is a pattern of openings 114 in the first semiconductor die 102 as shown in the side view of FIG. 5. The portions of the first semiconductor die 102 beneath the exposed openings 113 may for example be removed by deep reactive ion etch (DRIE). The openings 114 in the first semiconductor die 102 may have straight or planar side walls. In further embodiments, the openings 114 may be slanted (wider at the upper or lower surface of the first semiconductor die 102) or may be concave (wider mid-way through the first semiconductor die 102). The openings 114 in the first semiconductor die 102 may be formed by other methods in further embodiments, including by laser or mechanical drill.

The openings 114 are formed down through the first semiconductor die 102, but openings 114 do not extend through the polyimide layer 107 including traces 110 on the bottom surface of the first semiconductor die 102. The polyimide layer 107 and traces 110 remain intact and exposed at the bottom of the openings 114 in the first semiconductor die 102.

After the openings 114 are formed, the openings 114 may be filled in step 204 with an electrically insulating compound 120 as shown in the side view of FIG. 6 and the top view of FIG. 7. In the embodiment shown, the compound 120 is molded into the openings 114 in the shape of a pair of strips at opposed edges of the first semiconductor die 102, across the width of the first semiconductor die 102. As explained hereinafter, the openings 114 may be in other positions through the surface of the first semiconductor die 102, including across the length and/or width, and may have other shapes in further embodiments.

The compound 120 may be any of a wide variety of electrically inert, thermoplastic resins or thermosetting polymers, such as for example polycarbonate, or a polycarbonate-acrylonitrile butadiene styrene polymer (PC-ABS) blend. The compound 120 may be or include a solid epoxy resin, Phenol resin, fused silica, crystalline silica, carbon black and/or metal hydroxide.

The compound 120 may be applied as a liquid, and thereafter cured to a solid within openings 114, as for example by heating. The compound may 120 be spin-coated, sprayed or otherwise applied onto the upper surface of the first semiconductor die 102. Thereafter, the compound 120 may fill the openings 114 by gravity, pressure or by a mechanical component such as a squeegee device. The amount of compound 120 within the openings 114 may be controlled so as to completely fill the openings 114, and to be flush with an upper surface of the first semiconductor die 102. This may be done by removing the excess compound above the upper rim of openings 114 while the compound 120 is still in liquid form, or after the compound 120 has been cured, as by mechanical polishing.

In step 208, a second semiconductor die 124 may be added onto the first semiconductor die 102 to form a die stack (two semiconductor die at this point) as shown in the side view of FIG. 8. The second semiconductor die 124 may for example be a memory die such as 2D NAND flash memory or 3D BiCS (Bit Cost Scaling), V-NAND or other 3D flash memory. However, other types of semiconductor dies may be used, including for example a controller die such as an ASIC, or RAM such as an SDRAM, DDR SDRAM, LPDDR and GDDR. The second semiconductor die 124 may be affixed to an upper surface of the first semiconductor die 102 by a die attach film (DAF) on a lower surface of the second semiconductor die 124. The second semiconductor die 124 may have the same footprint as the first semiconductor die 102, though it need not in further embodiments.

In step 210, a pattern of openings may be formed through the second semiconductor die 124. In particular, as shown in FIG. 8, a photoresist layer 112 may be applied on an exposed surface of the second semiconductor die 124 opposite that mounted on the first semiconductor die 102. A mask including a desired pattern of openings is applied to the photoresist layer 112, and the layer 112 is developed to define openings 113 in photoresist layer 112. In accordance with aspects of the present technology, the mask is provided so that the openings 113 in the photoresist layer 112 on the second semiconductor die 124 align directly over the openings 114 filled with compound 120 in the first semiconductor die 102.

Step 210 next involves removal of the portions of the second semiconductor die 124 beneath the exposed openings 113. The result is a pattern of openings 114 in the second semiconductor die 124 directly over, and aligned with, openings 114 in the first semiconductor die 102 filled with compound 120 as shown in the side view of FIG. 9. The openings 114 in the second semiconductor die 124 may be formed in the same way as the openings 114 in the first semiconductor die 102.

FIG. 9A is an enlarged view showing greater detail of a portion 9A-9A in FIG. 9. In embodiments, the second semiconductor die 124 includes a pattern of traces 116 formed in a polyimide layer 118 on a bottom surface of the second semiconductor die 124. As one example for forming traces 116 and layer 118, a seed layer may be sputtered onto an active surface of the second semiconductor die 124 (facing downward in FIG. 9A). The active surface of the second semiconductor die may be covered with a passivation layer, with exposed vias or pads (not shown) electrically coupled to the integrated circuits within the second semiconductor die 124. The seed layer may be applied over the passivation layer and vias/pads.

A photoresist layer may then be spin coated over the seed layer, and developed to remove portions of the photoresist layer over the vias/pads and to expose the seed layer in the pattern of the finished electrical traces 116 (extending from the vias/pads). Copper (or other metal) may then be electroplated onto the portions of the seed layer exposed through the photerisist to form the electrical traces 116 coupled to the vias/pads. The photoresist and seed layer may then be removed to leave the electrical traces 116 on the passivation layer on the active surface of the second semiconductor die 124. The electrical traces 116 may be formed by other known processes in further embodiments. The active surface of the semiconductor die 124 may then be coated in a polyimide layer 118, with the traces 116 embedded within the polyimide layer as shown in FIG. 9A. A die attach film (DAF) layer 119 may next be applied over the polyimide layer. The DAF layer is used to affix the second semiconductor die 124 onto the first semiconductor die 102 and die stack.

After the second semiconductor die 124 is affixed to the first semiconductor die 104 and the openings 114 is formed, the traces 116 are exposed at the bottom of openings 114 as shown in FIG. 9A. The opposite ends of the traces 116 may be coupled to the vias/pads in the active surface of the semiconductor die. The openings 114 are formed down through the second semiconductor die 124, but openings 114 do not extend through the polyimide layer 118. The polyimide layer 118, traces 116 and DAF 119 remain intact at the bottom of the openings 114.

Figure 10:
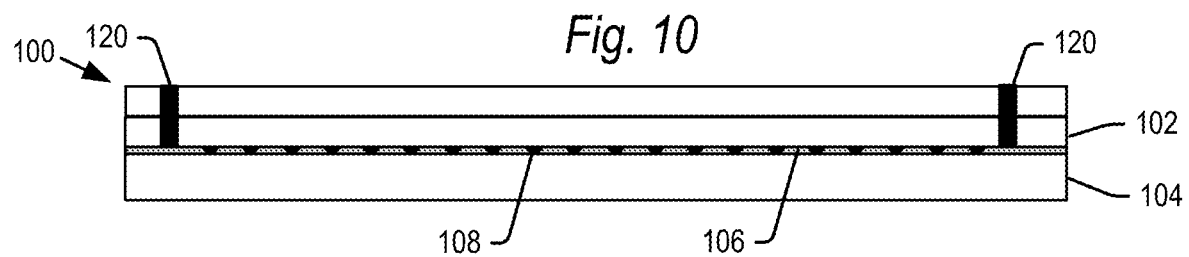
Figure 11:
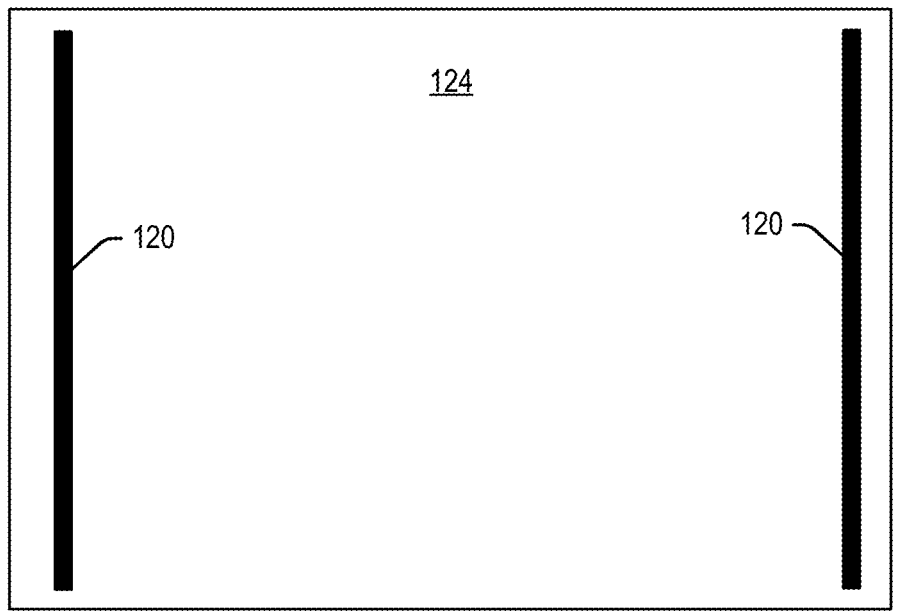
FIG. 11 is a top view of the second semiconductor die after the processing steps of FIGS. 8-10.

After the openings 114 in the second semiconductor die 124 are formed, the openings 114 may be filled in step 214 with electrically insulating compound 120 as shown in the side view of FIG. 10 and the top view of FIG. 11. The compound 120 may be any of the compounds used in the openings 114 in the semiconductor die 102 described above, and may be applied in the same manner as the compound used in the semiconductor die 102 described above. In embodiments, the compound 120 used in the second semiconductor die 124 is the same compound 120 used in the first semiconductor die 102, though it need not be in further embodiments. As seen for example in FIG. 10, the compound 120 in the openings 114 in the first and second stacked semiconductor dies 102, 124 form molded columns of compound 120. The molded columns of compound 120 are also referred to herein simply as molded columns 120.

Figure 12:
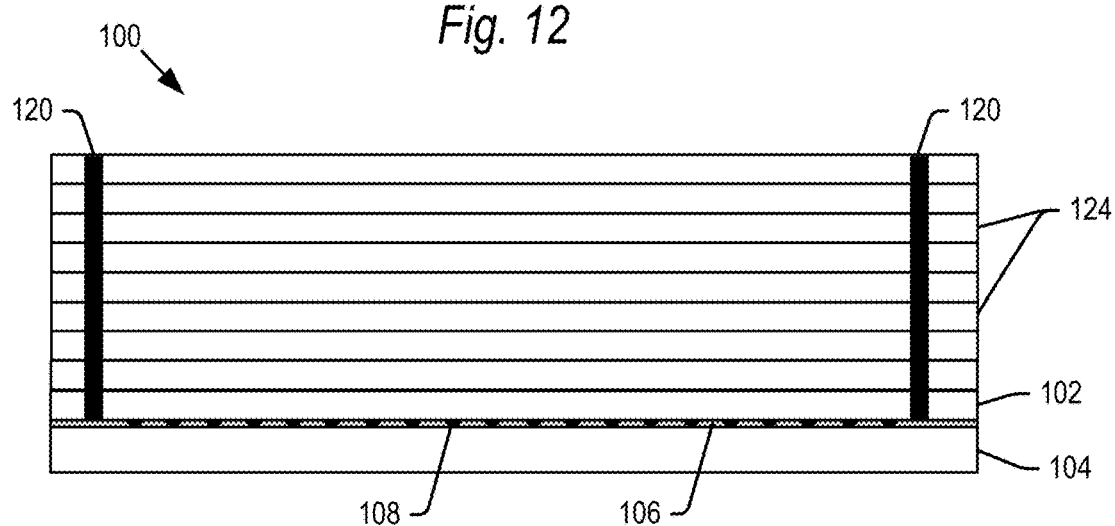
FIGS. 12-15 are side and top views of a semiconductor device including a stack of semiconductor dies at further steps in the fabrication process according to an embodiment of the present technology.

Steps 208, 210 and 214 may be repeated to add additional second semiconductor dies 124 onto the die stack. FIG. 12 shows a side view of a semiconductor device 100 including a first semiconductor die and eight second semiconductor dies 124 in the die stack. Each of the added second semiconductor dies 124 may be as described above, e.g., a flash memory semiconductor die including a pattern of electrical traces 116 on a bottom surface of the semiconductor die 124.

As shown in FIG. 12, each additional second semiconductor die 124 added to the die stack may be processed to include openings 114 filled with compound so that the molded columns 120 extend through all semiconductor dies in the die stack. While eight second semiconductor dies 124 are shown, embodiments may include different numbers of second semiconductor dies 124, including for example 1, 2, 4, 8, 16, 32 or 64 dies. There may be other numbers of dies in further embodiments.

Figure 13:
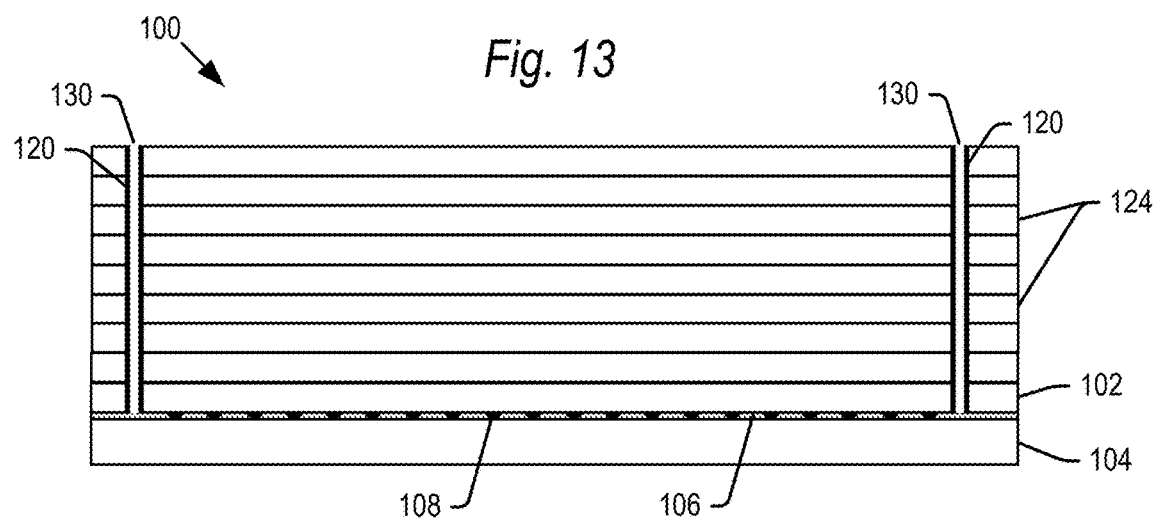

Once all semiconductor dies are added to the die stack, vias 130 may be formed in the molded columns 120 as shown for example in the side view of FIG. 13. The vias 130 may be formed for example by laser drilling down through the entirety of the molded columns 120, from the upper surface of the topmost semiconductor die 124 down to the bottom surface of the first semiconductor die 102. Vias 130 may be formed by methods other than laser drilling in further embodiments, such as for example by mechanical drilling, etching or photolithographic processes.

Figure 14:
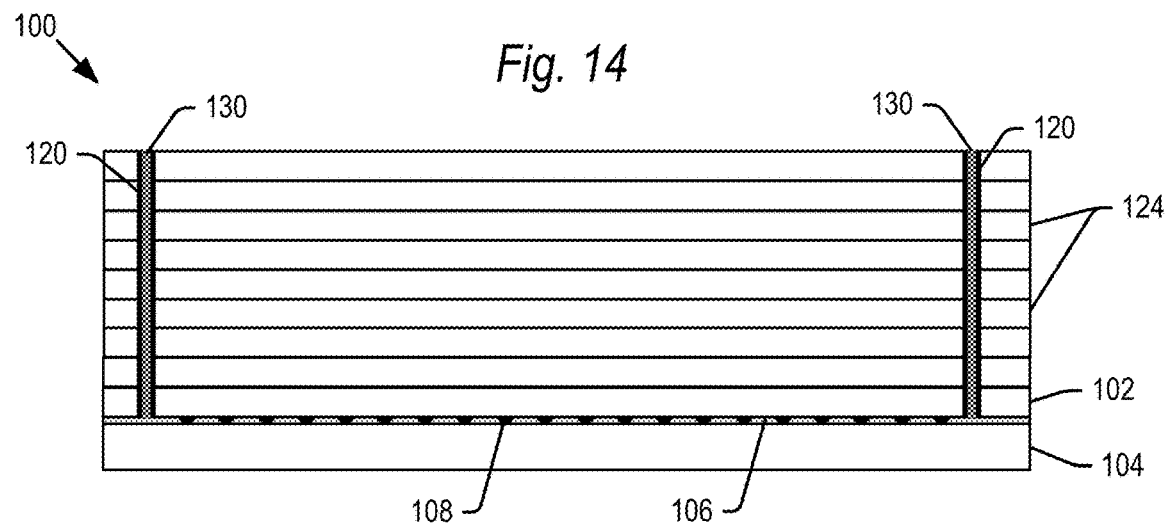
Figure 15:
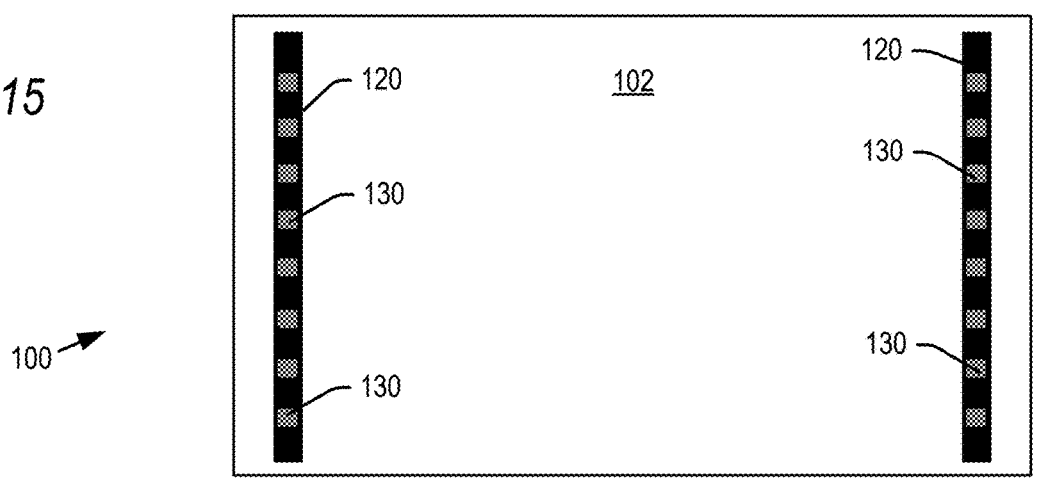

As shown in the side view of FIG. 14 and in the top view of FIG. 15, the vias 130 may be plated and/or filled with an electrical conductor, such as for example copper, although other suitable materials may be used such as aluminum, tungsten, tin, nickel, gold, doped polysilicon, and alloys (including copper alloys) or combinations thereof. As seen, the vias 130 are formed entirely within the molded columns 120. The particular number and pattern of vias 130 in the molded columns 120 is shown by way of example only, and there may be more vias 130 and a different pattern of vias 130 in further embodiments. While the vias 130 are shown in FIG. 15 as being square or rectangle in cross-section, the vias 130 may be other shapes in cross-section, such as for example circular.

As shown in the side view of FIG. 16, a dielectric material such as a polyimide layer 132 may be applied to the top surface of the uppermost semiconductor die 124 in step 226 to cover and electrically isolate the upper ends of vias 130. As is also shown in FIG. 16, the carrier 104 may be removed in step 230. Carrier 104 may be removed by applying heat, laser or chemicals to dissolve the release layer 106.

FIG. 16A is an enlarged view showing greater detail of a portion 16A-16A in FIG. 16. As noted above, each of the second semiconductor dies 124 includes a pattern of traces 116 formed in a polyimide layer 118 on a bottom surface. As shown in FIG. 16A, traces 116 extend into the openings 114 filled with compound 120. The vias 130 are formed into the molded columns 120 through all layers (semiconductor dies 102, 124, traces 116, polyimide layers 118 and DAF layers 119). The conductive material in the vias 130 couples with the traces 116 at each layer of the second semiconductor dies, as well as the traces 110 on the bottom of the first semiconductor die 102.

As noted above, the traces 116 in the second semiconductor dies 124 electrically connect to a pattern of vias or pads (not shown) on the active surfaces of each of the second semiconductor dies 124. Thus signals and voltages from each second semiconductor die 124 may be routed to the vias 130 by the traces 116, and from the vias 130 to the solder balls 108 on the first semiconductor die by the traces 110. Signals and voltages may likewise be routed to each of the semiconductor dies 124 using the reverse path.

As noted above, multiple semiconductor devices 100 may be formed on the carrier 104. Where individual semiconductor dies 102, 124 (i.e., already diced from a wafer) are stacked on top of the carrier 104, fabrication of the respective semiconductor devices 100 may be complete after separation from the carrier 104.

However, in further embodiments, one or more of the semiconductor dies 102, 124 may be affixed to the carrier 104 while still part of the wafer from which the semiconductor dies 102, 124 were fabricated. For example, a wafer of first semiconductor dies 102 may be affixed to the carrier 104, and thereafter stacks of individual second semiconductor dies 124 (i.e., already diced from their wafers) may be stacked on the respective first semiconductor dies 102 in the wafer. As a further example, the first semiconductor die 102 and all second semiconductor dies 124 may be stacked on top of each other while still part of their respective wafers.

In embodiments where one or more wafers are stacked on top of carrier 104, after the carrier 104 is removed, the wafers may be diced (in step 232) to complete the fabrication of the respective semiconductor devices 100. While straight line cuts will define generally rectangular or square shaped semiconductor devices 100, it is understood that semiconductor device 100 may have shapes other than rectangular and square in further embodiments.

Figure 17:
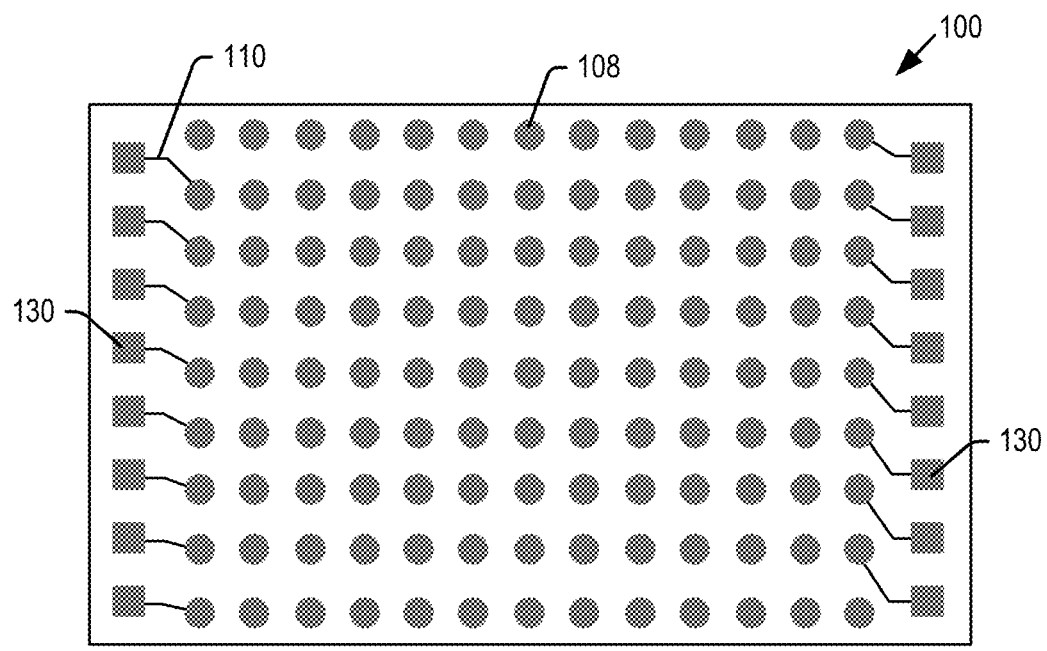

The side and bottom views of FIGS. 16, 16A and 17 show a finished semiconductor device 100 according to embodiments of the present technology. As seen for example in FIG.

17, the traces 110 may electrically connect the vias 130 to solder balls 108 enabling the transfer of signals and voltages between the semiconductor device 100 and a host device such as a printed circuit board (not shown) to which solder balls 108 are mounted. As noted, the particular pattern of solder balls 108, traces 110 and vias 130 is by way of example only, and may vary in further embodiments.

Additionally, as noted, the molded columns 120 may vary from that shown in FIGS. 7 and 11. FIG. 18 is a top view of a semiconductor device 100 showing one such alternative embodiment. As shown, instead of continuous strips, the molded columns 120 are formed into a number of discrete areas, with a via 130 being formed within each discrete area. Other configurations of the molded columns 120 are possible.

In embodiments described above, a semiconductor die 102, 124 was added to the stack. Next, the openings 114 were formed and filled with compound 120, and thereafter the vias 130 were drilled into the molded columns of compound 120. These steps may be performed in different orders in further embodiments. For example, openings 114 may be formed and filled with compound 120, and vias 130 formed in the compound 120 in semiconductor die 102, 124 before they are stacked onto the carrier 104. The filled openings 114 and vias 130 in this example may be formed before or after the semiconductor dies 102, 124 are diced from the respective wafers.

As a further example, openings 114 may be formed and filled with compound 120 in the semiconductor dies 102, 124 before they are stacked onto the carrier 104. Once the semiconductor dies 102, 124 are stacked on the carrier 104, the vias 130 may then be drilled down through the molded columns of compound 120. Other combinations of steps are contemplated.

In summary, in one example, the present technology relates to a semiconductor device, comprising: a semiconductor die; conductive traces coupled to the semiconductor die; an opening formed through the semiconductor die; a compound within the opening; and one or more vias formed within the compound and electrically coupled to one or more conductive trace of the conductive traces.

In another example, the present technology relates to a semiconductor device, comprising: a plurality of stacked semiconductor die; conductive traces on surfaces of the plurality of stacked semiconductor die; a plurality of openings, an opening of the plurality of openings formed through each semiconductor die of the plurality of semiconductor dies, wherein the plurality of openings on the plurality of stacked semiconductor dies are aligned with each other; a compound within the plurality of openings; and one or more vias formed through the compound in the plurality of openings and electrically coupled to one or more conductive trace of the conductive traces.

In a further example, the present technology relates to a method of forming a semiconductor device, comprising: forming an opening in a first semiconductor die, the first semiconductor die including a conductive trace; filling the opening with an electrically insulative compound; curing the electrically insulative compound; and forming a via through the insulative compound, electrically coupled to the conductive trace.

In another example, the present technology relates to a semiconductor device, comprising: a plurality of stacked semiconductor die; first electrical conductor means on surfaces of the plurality of stacked semiconductor die for conducting electrical signals; opening means, formed through the plurality of semiconductor dies, for receiving a compound means; a compound means for filling the opening means; and second electrical conductor means formed through the compound means for conducting electrical signals from the first electrical conductor means.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:
1. A semiconductor device, comprising:
a semiconductor die;
conductive traces on the semiconductor die;
an opening formed through the semiconductor die;
a compound within the opening; and
one or more vias, comprising an electrical conductor, formed within the compound and electrically coupled to one or more conductive trace of the conductive traces;
wherein the conductive traces are formed on a layer attached to the semiconductor die, and wherein the one or more vias are formed through the layer.

2. The semiconductor device of claim 1, wherein the conductive traces extend into the opening formed through the semiconductor die, the one or more vias formed within the compound lying in physical contact with the conductive traces.

3. The semiconductor device of claim 1, wherein the opening comprises a number of discrete areas, with a via being formed within each discrete area.

4. The semiconductor device of claim 1, wherein the one or more vias comprise a plurality of vias formed in the compound.

5. The semiconductor device of claim 1, wherein the compound is one of a thermoplastic resin and thermosetting polymer.

6. The semiconductor device of claim 1, wherein the compound is a cured compound.

7. The semiconductor device of claim 1, wherein the opening comprises a strip across one of the length and width of the semiconductor die.

8. The semiconductor device of claim 7, wherein the opening is along an edge of the semiconductor die.

9. A semiconductor device, comprising:
a plurality of stacked semiconductor die;
first means on surfaces of the plurality of stacked semiconductor die for conducting electrical signals;
second means, formed through the plurality of semiconductor dies, for receiving a material;
third means for filling the second means; and
fourth means formed through the third means for conducting electrical signals from the first means;
wherein the first means are formed on a layer attached to the semiconductor die, and wherein the fourth means are formed through the layer.

10. A semiconductor device, comprising:
a plurality of stacked semiconductor die;
conductive traces on surfaces of the plurality of stacked semiconductor die;

a plurality of openings, an opening of the plurality of openings formed through each semiconductor die of the plurality of semiconductor dies, wherein the plurality of openings on the plurality of stacked semiconductor dies are aligned with each other;

a compound within the plurality of openings; and one or more vias, comprising an electrical conductor, formed through the compound in the plurality of openings and electrically coupled to one or more conductive trace of the conductive traces;

wherein the conductive traces extend into the plurality of openings formed through the plurality of semiconductor dies, the one or more vias formed within the compound lying in physical contact with the conductive traces.

11. The semiconductor device of claim 10, wherein the a first semiconductor die of the plurality of semiconductor dies is a controller die, and at least a second semiconductor die of the plurality of semiconductor die is a memory die.

12. The semiconductor device of claim 10, wherein the compound in the plurality of aligned openings comprises a molded column extending through each of the plurality of semiconductor dies.

13. The semiconductor device of claim 10, wherein the plurality of openings comprise a strip across one of the length and width of the plurality of semiconductor dies.

14. The semiconductor device of claim 10, wherein the plurality of openings comprise a number of discrete areas, with a via being formed within each discrete area.

15. The semiconductor device of claim 10, wherein a via of the one or more vias comprises a hole straight through the plurality of semiconductor dies.

16. The semiconductor device of claim 10, wherein the one or more vias comprise a plurality of vias formed in the compound.

17. The semiconductor device of claim 10, wherein the compound is one of a thermoplastic resin and thermosetting polymer.

18. The semiconductor device of claim 10, wherein the conductive traces are formed on a plurality of layers, each attached to a surface of the plurality of semiconductor dies, and wherein the one or more vias are formed through the plurality of layers.

19. The semiconductor device of claim 18, wherein the plurality of openings are not formed through the plurality of layers.

\* \* \* \* \*